United States Patent
Lin et al.

(10) Patent No.: US 8,729,681 B2
(45) Date of Patent: May 20, 2014

(54) PACKAGE STRUCTURE AND LED PACKAGE STRUCTURE

(75) Inventors: Chen-Hsiu Lin, Tucheng (TW); Chih-Chiang Kao, Zhonghe (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 827 days.

(21) Appl. No.: 12/889,875

(22) Filed: Sep. 24, 2010

(65) Prior Publication Data

US 2011/0175134 A1 Jul. 21, 2011

(30) Foreign Application Priority Data

Jan. 20, 2010 (CN) .......................... 2010 1 0000789

(51) Int. Cl.
*H01L 23/495* (2006.01)

(52) U.S. Cl.
USPC .................................. 257/667; 257/E33.056

(58) Field of Classification Search
USPC ............ 257/E33.056, E33.066, 667, E33.058
See application file for complete search history.

(56) References Cited

U.S. PATENT DOCUMENTS

| | | | | |
|---|---|---|---|---|
| 4,862,246 A * | 8/1989 | Masuda et al. | ................ | 257/667 |
| 6,794,738 B2 * | 9/2004 | Mahle | ............ | 257/667 |
| 7,397,112 B2 * | 7/2008 | Sato et al. | ..................... | 257/676 |
| 7,446,397 B2 * | 11/2008 | Gai | ............................... | 257/667 |
| 7,719,024 B2 * | 5/2010 | Bando | ........................... | 257/676 |
| 7,759,775 B2 * | 7/2010 | Sun et al. | ....................... | 257/666 |
| 2006/0278882 A1 * | 12/2006 | Leung et al. | ..................... | 257/98 |
| 2010/0052149 A1 * | 3/2010 | Nose et al. | .................... | 257/692 |

* cited by examiner

*Primary Examiner* — Stephen W Smoot
*Assistant Examiner* — Sun M Kim
(74) *Attorney, Agent, or Firm* — Li & Cai Intellectual Property (USA) Office

(57) ABSTRACT

A package structure includes a base unit, a pin unit and a housing unit. The base unit has a carrier member and a through hole penetrating through the carrier member, and at least one annular structure is formed in the through hole. The pin unit has a plurality of conductive pins disposed beside the carrier member. The housing unit has an annular housing encircling the carrier member to envelop one part thereof and connecting to the pin unit, and the annular housing is partially filled into the through hole to cover the annular structure. Therefore, the instant disclosure can increase the bonding force between the carrier member and the annular housing and retard external moisture to permeate through slits between the carrier member and the annular housing to intrude into the chip-mounting region, thus the reliability and the usage life are increased.

12 Claims, 5 Drawing Sheets

PACKAGE STRUCTURE AND LED PACKAGE STRUCTURE

BACKGROUND OF THE INVENTION

1. Field of the Invention

The instant disclosure relates to a package structure and an LED package structure, in particular, to a package structure and an LED package structure to enhance the structural strength and retard external moisture to intrude into chip-mounting region.

2. Description of Related Art

In general, LED (Light-Emitting Diode) has some advantages better than a traditional light source, such as small size, power saving, excellent light efficiency, long life, high-speed modulation response and mercury free. In recent years, the LED has been widely used in several applications and entered into everyone's daily life. Hence, the traditional lighting source has been replaced by LED with high brightness such as a high power LED due to the progress of high technology.

In addition, the high power LED will generate more high heat, thus the traditional package structure needs to use large slug to dissipate the heat. However, when pre-molding package gel (plastic material) adheres the slug (metal), the bonding force (the structural strength) between the package gel and the slug is bad. Furthermore, the traditional package structure usually has some slits between the package gel and the slug, and external moisture will permeate through the slits to intrude into chip-mounting region of the LED, thus the chip-mounting region will be rusted.

SUMMARY OF THE INVENTION

In view of the aforementioned issues, the instant disclosure provides a package structure and an LED package structure to enhance the structural strength and retard external moisture to intrude into chip-mounting region.

To achieve the above-mentioned objectives, the instant disclosure provides a package structure, including a base unit, a pin unit and a housing unit. The base unit has a carrier member and at least one through hole penetrating through the carrier member, and at least one annular structure is formed in the at least one through hole. The pin unit has a plurality of conductive pins disposed beside the carrier member. The housing unit has an annular housing encircling the carrier member to envelop one part thereof and connecting to the pin unit, and the annular housing is partially filled into the at least one through hole to cover the at least one annular structure.

Moreover, the instant disclosure further provides an LED package structure that adds a light-emitting unit and a package unit to the package structure. The light-emitting unit has a plurality of LED chips disposed on the carrier member and being surrounded by the annular housing, and each of the LED chips is electrically connected between any two of the conductive pins. The package unit has a light-transmitting package body covering the LED chips and being surrounded by the annular housing.

Therefore, the instant disclosure can enhance the bonding force between the carrier member and the annular housing, and retard external moisture to permeate through slits between the carrier member and the annular housing to intrude into the chip-mounting region, thus the reliability and the usage life are enhanced.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated; however, the appended drawings are merely provided for reference and illustration, without any intention to be used for limiting the instant disclosure.

DETAILED DESCRIPTION OF THE PREFERRED EMBODIMENTS

FIGS. 1A to 1D show a package structure according to the first embodiment of the instant disclosure. The package structure of the first embodiment includes a base unit 1, a pin unit 2 and a housing unit 3.

Figures 1A, 1B:
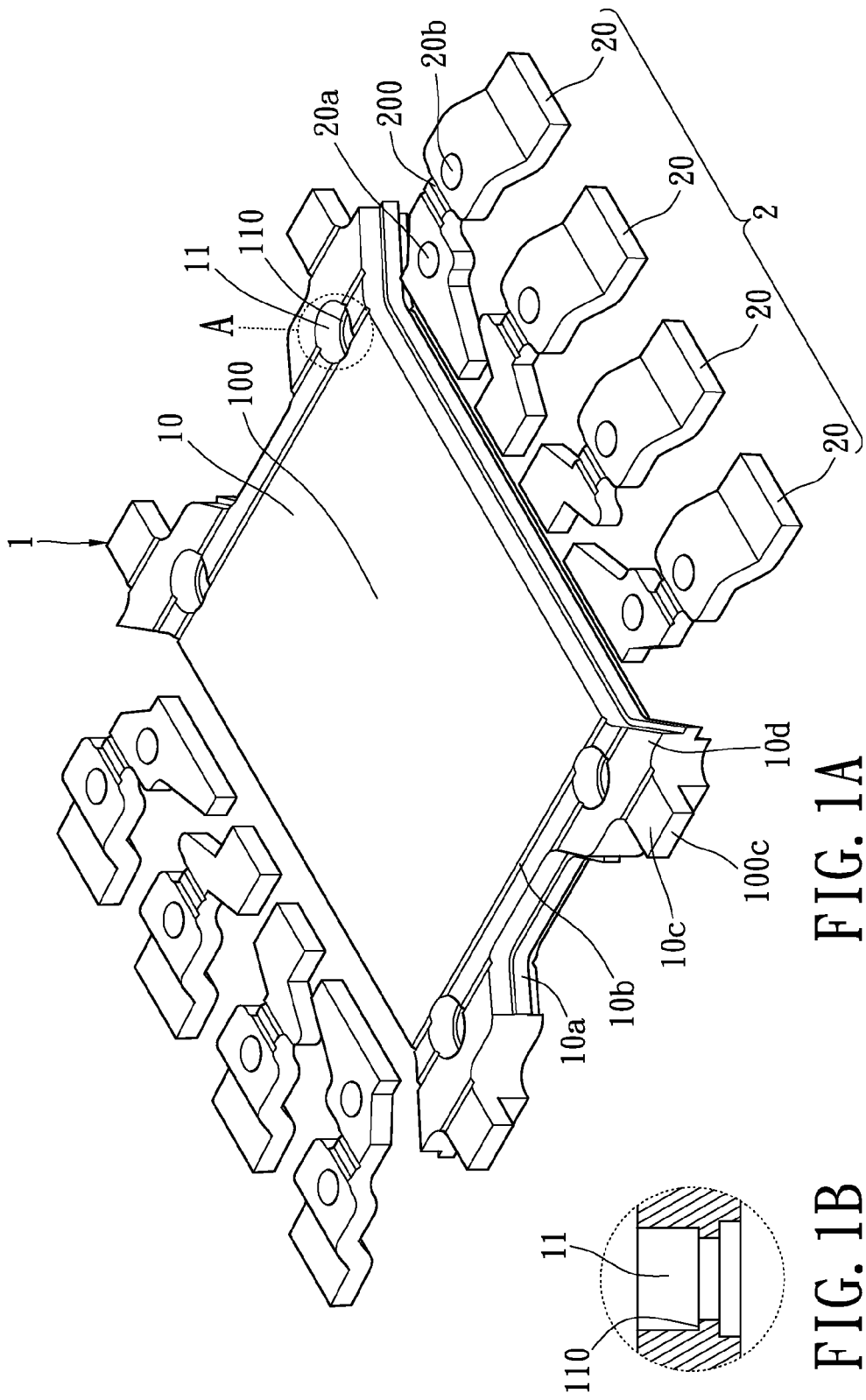
FIG. 1A is a perspective, schematic view of the relative position of the base unit and the pin unit according to the first embodiment of the instant disclosure.
FIG. 1B is a lateral, cross-sectional, schematic view of the A part in FIG. 1A.

Referring to FIG. 1A, it shows a schematic view of the relative position of the base unit 1 and the pin unit 2. In addition, FIG. 1B shows a cross-sectional view of the A part in FIG. 1A.

Moreover, the base unit 1 has a carrier member 10 and at least one through hole 11 penetrating through the carrier member 10. The carrier member 10 is usually made of metal material with high thermal conductivity coefficient. The carrier member 10 has a chip-mounting region 100 formed on a top surface thereof, and at least one annular structure 110 is formed in the through hole 11, i.e. the annular structure 110 is formed on an inner surface of the through hole 11. The carrier member 10 may be a one-piece heat-dissipating element in this embodiment. The carrier member 10 may be a two-piece structure in another embodiment. For example, the carrier member 10 has a carrier body (not shown) and a heat-dissipating layer (not shown) extended from the top surface of the carrier body to the bottom surface of the carrier body.

The barrier member 10 has a plurality of lateral projections 10a ready to be encapsulated by the housing unit 3. For example, the carrier member 10 has four sides (as shown in FIG. 1A) in the first embodiment. The lateral projections 10a may be disposed on the same side, on any two adjacent sides, on any two opposite sides, on any three sides or on the four sides. Of course, in another embodiment, the lateral projections 10a may be omitted, or the lateral projections 10a may be replaced by many lateral trenches (not shown), by at least one annular lateral trench (not shown) encircling a lateral periphery of the carrier member 10 or at least one continuous annular lateral projection (not shown). In other words, if designer uses many lateral projections 10a or many lateral trenches (not shown), the lateral projections 10a or the lateral trenches (not shown) may be selectively disposed on one or more sides of the carrier member 10; If designer uses the annular lateral trench (not shown) or at least one annular lateral projection (not shown), at least one annular lateral trench (not shown) or at least one annular lateral projection (not shown) may surround the whole side of the carrier member 10.

The carrier member 10 has a plurality of front trenches 10b that are formed on a top surface thereof and ready to be encapsulated by the housing unit 3. Of course, in another embodiment, the front trenches 10b may be omitted, or the front trenches 10b may be replaced by many front projections (not shown). In addition, many front trenches (not shown) or front projections (not shown) may be formed on the bottom surface of the carrier member 10 and ready to be encapsulated by the housing unit 3 according to different requirements.

The carrier member 10 has a plurality of union support structures 10c ready to be encapsulated by the housing unit 3 and extended outwards from the carrier member 10 and a plurality of projection structures 10d ready to be encapsulated by the housing unit 3 and correspond to the union support structures 10c. In addition, each of the union support structures 10c has a union cutting plane 100c formed on an end thereof and exposed from the housing unit 3, and each of the projection structures 10d is adjacent to each of the union support structures 10c and is extended outwards from a corner of the carrier member 10. In other words, the four projection structures 10d are projected from four corners of the carrier member 10 for enhancing a contact path between the side of the carrier member 10 and the housing unit 3.

For example, the carrier member 10 has four sides, four union support structures 10c (two pairs of union support structures 10c) and four projection structures 10d (two pairs of projection structures 10d) as shown in FIG. 1A.

Figure 1C:
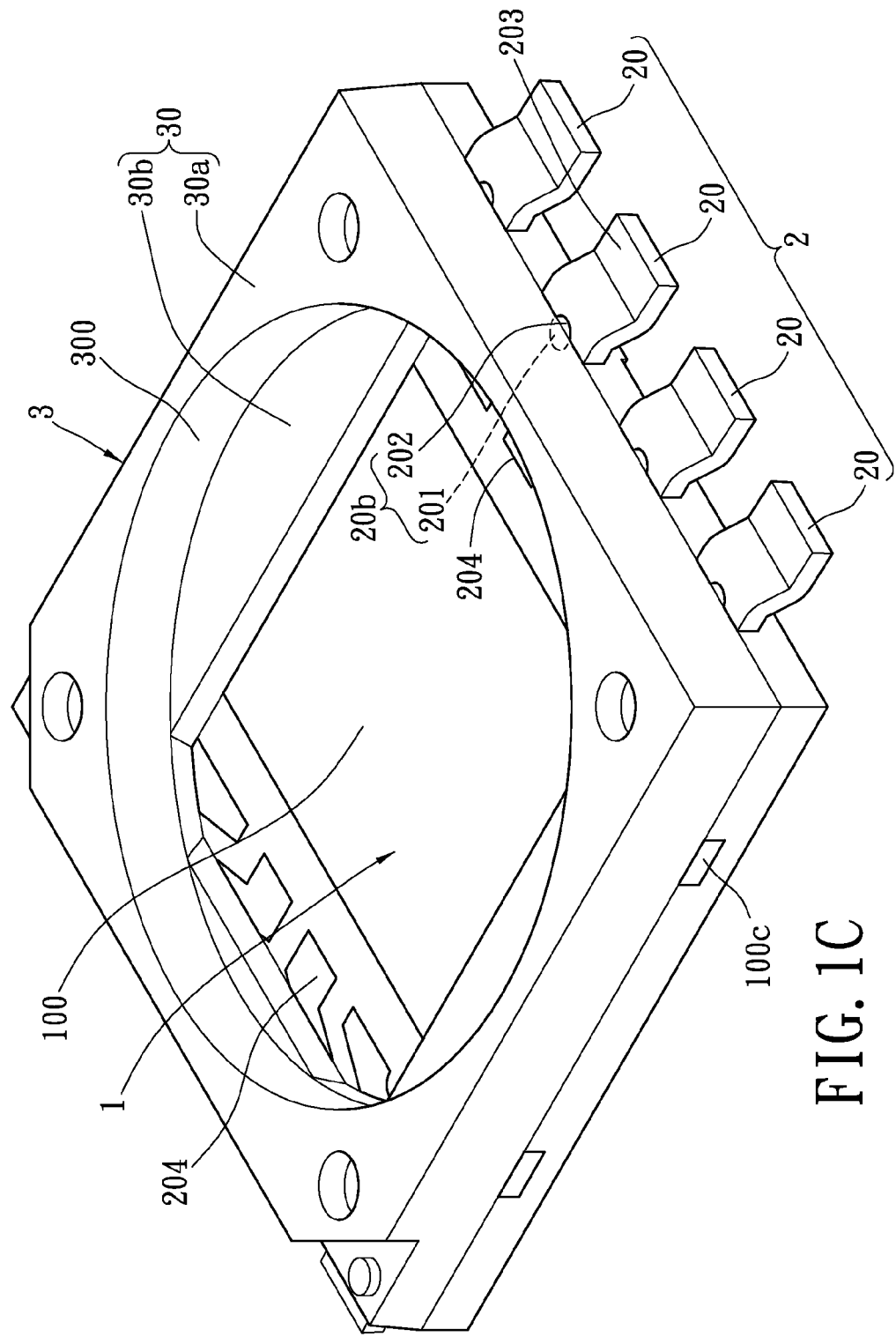
FIG. 1C is a perspective, schematic view of the package structure according to the first embodiment of the instant disclosure.

The two pairs of union support structures 10c are respectively disposed on two opposite sides of the carrier member 10, thus two of the union cutting planes 100c are exposed from one side of the carrier member 10 as shown in FIG. 1C.

The four projection structures 10d are respectively connected to the four union support structures 10c, and the two pairs of projection structures 10d are respectively projected from another two opposite sides of the carrier member 10. In addition, each of the four projection structures 10d and each four union support structures 10c are adjacent to each other to form a predetermined included angle between the projection structure 10d and the union support structure 10c. When the included angle is close to 90 degrees, each of the union support structures 10c and each of the projection structures 10d are connected to form a structure similar to an L shape.

Of course, the another embodiment may provide two union support structures 10c respectively disposed on two opposite sides of the carrier member 10, and each of the union support structures 10c is disposed on a center of each side of the carrier member 10 to obtain a balance effect for the carrier member 10. When only two union support structures 10c respectively disposed on the two opposite sides of the carrier member 10, it would be best for each of the union support structures 10c to use two projection structures 10d that are respectively disposed beside the two opposite sides of each of the union support structures 10c and respectively projected from two corresponding corners of the carrier member 10 (it means the four projection substrates 10d are respectively projected from the four corners of the carrier member 10).

Furthermore, the pin unit 2 has a plurality of conductive pins 20 disposed beside the carrier member 10. For example, the conductive pins 20 may be disposed beside the same side of the carrier member 10 or may be typically disposed beside two opposite side of the carrier member 10. In the first embodiment, FIG. 1A shows eight conductive pins 20 that are typically disposed beside two opposite side of the carrier member 10 (there are four conducive pins 20 beside each of the sides of the carrier member 10). Each of the conductive pins 20 has at least one inside pin hole 20a ready to be filled with the housing unit 3. Of course, the inside pin hole 20a may be omitted in the first embodiment. In addition, each of the conductive pins 20 has at least one pin trench 200 ready to be encapsulated by the housing unit 3. For example, each of the conductive pins 20 has two pin trenches 200 formed on a top surface thereof in the first embodiment. Of course, one or more trench structures may be formed on the top surface, the bottom surface or the side of each of the conductive pins 20 in other embodiments. In addition, the pin trenches 200 may be omitted in the instant disclosure, or the pin trenches 200 may be replaced by many pin projections (not shown). Besides, each of the conductive pins 20 has at least one outside pin hole 20b.

Referring to FIG. 1B, it shows a cross-sectional view of the A part in FIG. 1A. The annular structure 110 may be an inner projection in the first embodiment. In other words, the inner projection has an annular appearance and formed on the inner surface of the through hole 11, and the cross-sectional view of the through hole 11 in FIG. 1B shows as a I-shaped hole. Of courser, the inner projection may be replaced by an inner trench (not shown), thus the cross-sectional view of the through hole 11 would show as a crisscross appearance.

Figure 1D:
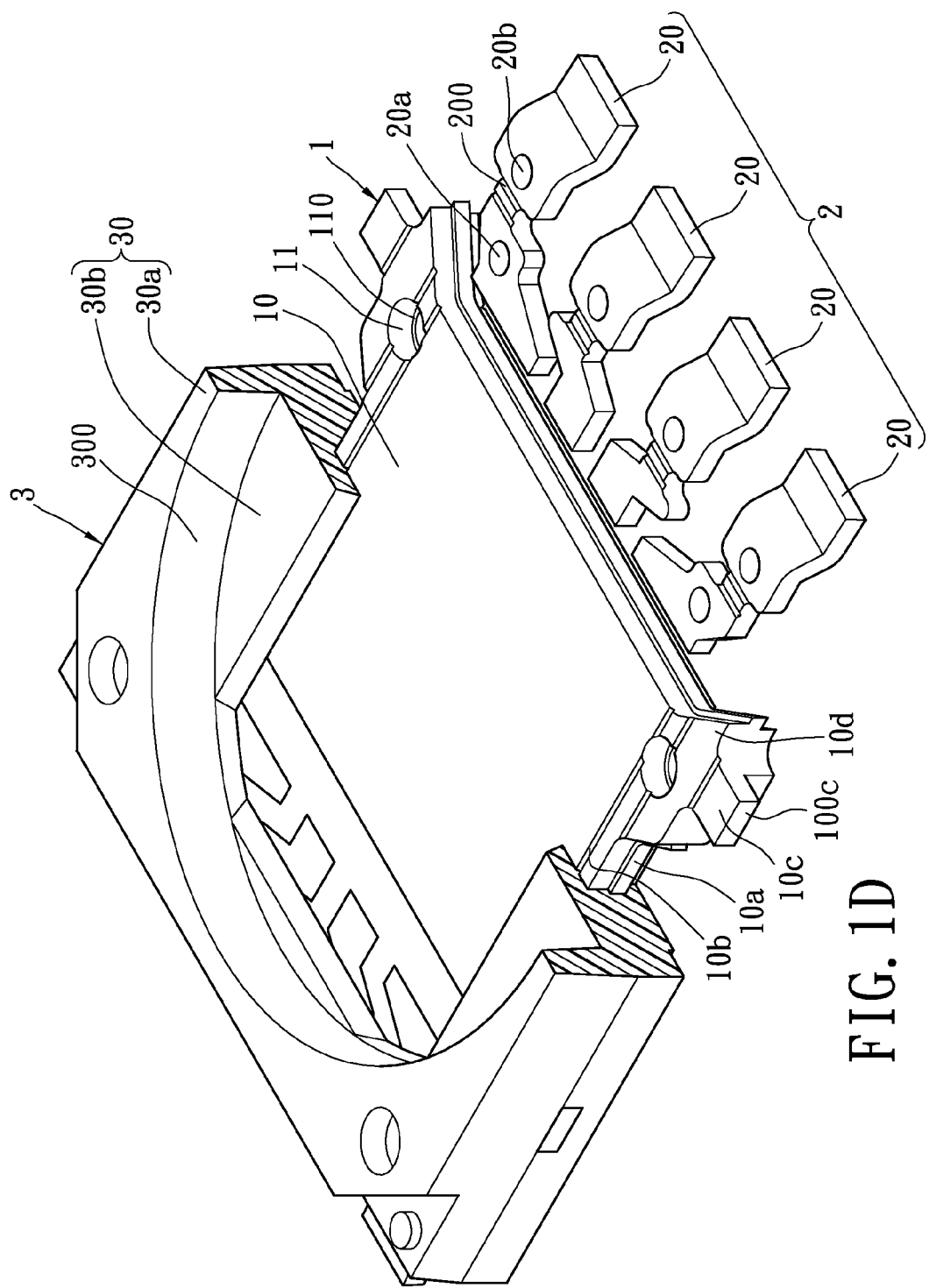
FIG. 1D is a partial, perspective, cross-sectional, schematic view of the package structure according to the first embodiment of the instant disclosure.

FIG. 1C shows a schematic view of the package structure according to the first embodiment of the instant disclosure. FIG. 1D shows a partial, view of the package structure according to the first embodiment of the instant disclosure. Comparing with FIG. 1A, FIGS. 1C and 1D add the housing unit 3 to partially envelop the base unit 1 and the pin unit 2.

The housing unit 3 is usually made of plastic material such as opaque and reflective plastic material. The housing unit 3 has an annular housing 30 encircling the carrier member 10 to envelop one part thereof and connecting to the pin unit 2. The annular housing 30 is partially filled into the through hole 11 (it means the through hole 11 is filled with or encapsulated by one part of the annular housing 30) to cover the annular structure 110 as shown in FIGS. 1A and 1B. In addition, the annular housing 30 has a encircling housing 30a surrounding the carrier member 10 and at least two extending housings 30b extended from an inner surface 300 of the encircling housing 30a to the carrier member 10 to envelop a top surface of the carrier member 10. For example, the annular housing 30 surrounds a peripheral portion (not shown) of the carrier member 10 and envelops one part of the carrier member 10 to expose partially a top surface of the carrier member 10 and a bottom surface of the carrier member 10. The peripheral portion is a periphery of the carrier member 10 enveloped by the annular housing 30, as shown in FIG. 1D. The annular housing 30 surrounds the peripheral portion of the carrier member 10 and envelops one part of each of the conductive pins 20 to expose a first end portion 203 of each of the conductive pins 20 and a top surface of the second end portion 204 of each of the conductive pins 20. The top surface of the second end portion 204 may be a wire-bonding region for achieving electrical connection.

Hence, when the carrier member 10 is encapsulated by the annular housing 30, the lateral projections 10a, the front trenches 10b, the union support structures 10c and the projection structures 10d of the carrier member 10 are encapsulated by the annular housing 30 and the union cutting plane 100c is exposed out of the annular housing 30. In addition, after each of the conductive pins 20 is encapsulated by the annular housing 30, the inner pin hole 20a of each of the conductive pins 20 are filled with the annular housing 30 and the pin trenches 200 are encapsulated by the annular housing 30. Each of the outside pin holes 20b is divided into a first hole portion 201 adjacent to the carrier member 10 and a second hole portion 202 connecting the first hole portion 201. The first hole portion 201 of each of the conductive pins 20 is filled with one part of the annular housing 30, and the second hole portion 202 of each of the conductive pins 20 is exposed from the annular housing 30.

Figure 2:
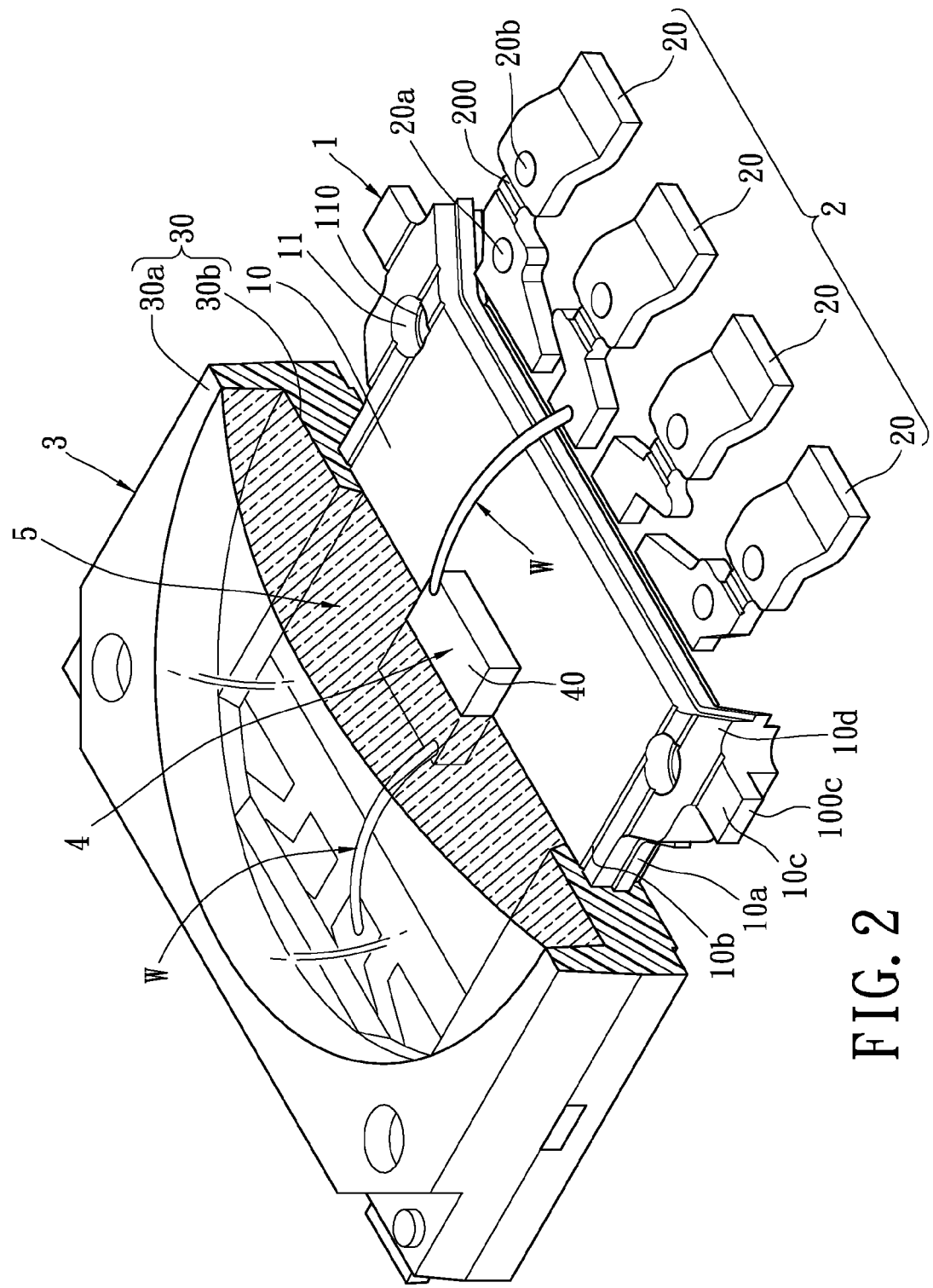
FIG. 2 is a partial, perspective, cross-sectional, schematic view of the LED package structure according to the first embodiment of the instant disclosure.

The package structure of the instant disclosure may be used for any type of light-emitting chip such as LED chip. For example, referring to FIG. 2, it shows a partial cross-sectional view of the LED package structure according to the first embodiment of the instant disclosure. The LED package structure of the instant disclosure includes a base unit 1, a pin unit 2, a housing unit 3, a light-emitting unit 4 and a package unit 5. The difference between FIG. 2 and FIG. 1D is that FIG. 2 adds the light-emitting unit 4, the package unit 5 and two conductive wires W.

The light-emitting unit 4 has a plurality of LED chips 40 (only one LED chip 40 is disclosed in FIG. 2 for example) disposed on the carrier member 10 and being surrounded by the annular housing 30. Each of the LED chips 40 is electrically connected between any two of the conductive pins 20. For example, each of the LED chips 40 is electrically connected between any two of the conductive pins 20 by at least two conductive wires W, thus the current path from any one conductive pin 20 to the LED chip 40 differs from the heat-dissipating path from the LED chip 40 to the carrier member 10. In other words, because the LED chip 40 is a horizontal chip, the conductive path and the heat-dissipating path are separated from each other.

Of course, the LED chip 40 may be a vertical chip, thus the conductive path and the heat-dissipating path are the same. In other words, the first embodiment can take one conductive wire W to electrically connect between the carrier member 10 and one conductive pin 20 (one electrode of the LED chip 40 contacts the carrier member 10) and take another conductive wire W to electrically connect between the LED chip 40 and another conductive pin 20 (another electrode of the LED chip 40 contacts the conductive wire W). Hence, the LED chip 40 may be electrically connected between any two of the conductive pins 20 by the method of combining the conductive path and the heat-dissipating path.

If the instant disclosure uses many LED chips 40 at the same time according to different requirements, the LED chips 40 may be selectively electrically connected between any two of the conductive pins 20 in parallel or in series. Of course, the LED chips 40 may be electrically connected between any two of the conductive pins 20 in parallel and in series at the same time. In addition, the package unit 5 has a light-transmitting package body (such as transparent gel or phosphor gel) covering the LED chips 40 and being surrounded by the annular housing 30.

In conclusion, the instant disclosure has at least one advantage shown as follows:

Because the instant disclosure provides the design of filling one part of the annular housing 30 into the through hole 11, the instant disclosure can increase the bonding force between the carrier member 10 and the annular housing 30, and retard external moisture to permeate through slits between the carrier member 10 and the annular housing 30 to intrude into the chip-mounting region 100. In addition, the instant disclosure may specially strengthen the structural strength between premold and metal slug to retard external moisture due to the design of forming the annular structure 110 on the inner surface of the through hole 11.

Because the instant disclosure provides the design of forming the lateral projections 10a on the side of the barrier member 10, the instant disclosure can increase the bonding force between the carrier member 10 and the annular housing 30, and extend path to retard external moisture to permeate through slits between the carrier member 10 and the annular housing 30 to intrude into the chip-mounting region 100.

Because the instant disclosure provides the design of forming the front trenches 10b on the top surface and/or the bottom surface of the barrier member 10, the instant disclosure can increase the bonding force between the top surface and/or the bottom surface of the carrier member 10 and the annular housing 30, and retard external moisture to permeate through slits between the carrier member 10 and the annular housing 30 to intrude into the chip-mounting region 100.

Because the instant disclosure provides the design of forming the projection structures 10d ready to be encapsulated by the housing unit 3 and correspond to the union support structures 10c, the instant disclosure can extend path to retard external moisture to permeate through slits between the union support structures 10c of the carrier member 10 and the annular housing 30 to intrude into the chip-mounting region 100.

The instant disclosure provides the designs of filling one part of the annular housing 30 into the first hole portion 201 of each of the conductive pins 20 and exposing the second hole portion 202 of each of the conductive pins 20 therefrom to reduce the contact area between the annular housing 30 and each of the conductive pins 20, thus instant disclosure can retard external moisture to permeate through slits between the annular housing 30 and each of the conductive pins 20 to intrude into the chip-mounting region 100.

Because the instant disclosure provides the design of forming the at least two extending housings 30b that are extended from the inner surface 300 of the encircling housing 30a to the carrier member 10 to envelop the top surface of the carrier member 10, the instant disclosure can increase the bonding force between the top surface of the carrier member 10 and the annular housing 30, and enlarge contact area between package unit 5 and the annular housing 30. Therefore, the instant disclosure can decrease the probability of separating the annular housing 30 from the carrier member 10 and decrease the contact area between the package unit 5 and the carrier member 10 to decrease the probability of separating the package unit 5 from the carrier member 10 made of metal due to the low bonding force between the package unit 5 and the metal carrier.

Figure 3A:
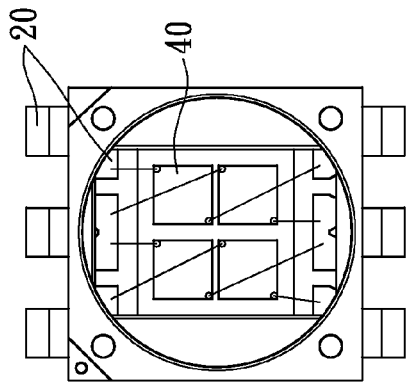
FIGS. 3A to 3F are top schematic views of the LED package structure using various wire-bonding methods according to the second embodiment of the instant disclosure, respectively.
Figure 3B:
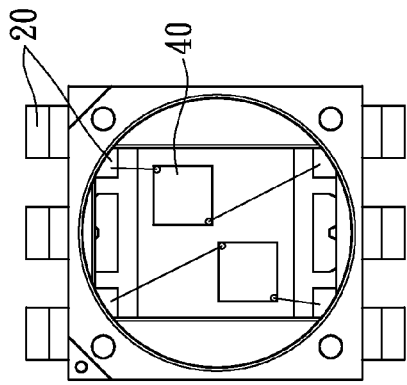
Figure 3C:
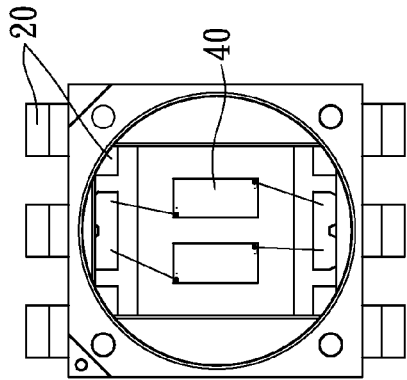
Figure 3D:
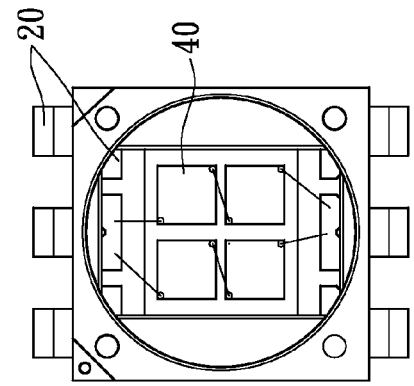
Figure 3E:
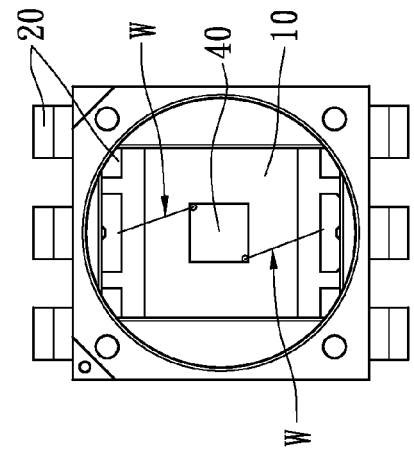
Figure 3F:
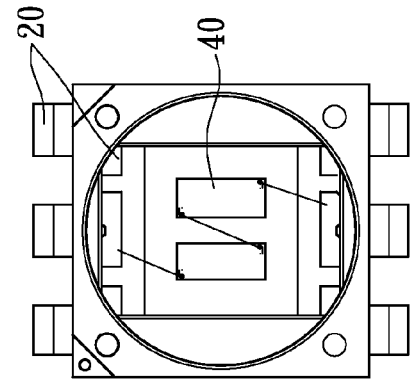

Referring to FIGS. 3A to 3F, the second embodiment of the instant disclosure shows six LED package structures using different wire-bonding methods, thus the instant disclosure also can provide the LED package structure with six conductive pins 20. FIG. 3A discloses that each of the LED chips 40 is electrically connected between every two symmetrical or asymmetric conductive pins 20. FIG. 3B discloses that each of the LED chips 40 is electrically connected between every two symmetrical or asymmetric conductive pins 20. FIG. 3C discloses that two LED chips 40 are collectively electrically connected between two symmetrical or asymmetric conductive pins 20. FIG. 3D discloses that every two LED chips 40 are electrically connected in series between two symmetrical or asymmetric conductive pins 20. FIG. 3E discloses that an LED chip 40 is electrically connected between two symmetrical or asymmetric conductive pins 20. FIG. 3F discloses that two LED chips 40 are electrically connected between two symmetrical or asymmetric conductive pins 20.

Furthermore, in general, there are two types of the LED chips including horizontal type and vertical type. The horizontal LED chip has at least two electrodes disposed on a top surface thereof, and the vertical LED chip has at least two electrode respectively disposed on a top surface and a bottom surface thereof. The LED chips 40 of the instant disclosure can be horizontal LED chips that are applied to the above-mentioned wire-bonding methods as shown in FIGS. 3A to 3F. However, in another embodiment, if the LED chip 40 in FIG. 3E is a vertical LED chip, one conductive wire W is only changed to electrically connect between the conductive pin 20 and the carrier member 10 to achieve electrical connection effect for the LED chip 40.

Moreover, in another embodiment, when using many LED chips 40, the LED chips 40 may be selected from horizontal LED chips and vertical LED chips. In addition, the former description of electrically connecting each of the LED chips 40 between two conductive pins 20 is just an example not to limit the instant disclosure. In other words, the designer not only can use the LED chips 40 of different numbers and types (such as using single horizontal LED chip or single vertical LED chip, or using the horizontal LED chip and the vertical LED chip at the same time), but also can electrically connect the LED chips 40 in parallel, in series or in parallel and series.

The above-mentioned descriptions represent merely the preferred embodiment of the instant disclosure, without any intention to limit the scope of the instant disclosure thereto. Various equivalent changes, alternations or modifications based on the claims of instant disclosure are all consequently viewed as being embraced by the scope of the instant disclosure.

What is claimed is:

1. A package structure, comprising:
   a base unit having a carrier member and at least one through hole penetrating through the carrier member, wherein at least one annular structure is formed in the at least one through hole;
   a pin unit having a plurality of conductive pins disposed beside the carrier member; and
   a housing unit having an annular housing encircling the carrier member to envelop one part thereof and connecting to the pin unit, wherein the annular housing is partially filled into the at least one through hole to cover the at least one annular structure;
   wherein each of the conductive pins has at least one inside pin hole and at least one outside pin hole, the at least one inside pin hole is filled with the annular housing, the at least one outside pin hole has a first hole portion adjacent to the carrier member and a second hole portion connecting to the first hole portion, the first hole portion of each of the conductive pins is filled with the annular housing, the second hole portion of each of the conductive pins is exposed from the annular housing, and each of the conductive pins has at least one pin trench or pin projection encapsulated by the annular housing.

2. The package structure according to claim 1, wherein the carrier member has a plurality of front trenches or front projections on a top surface thereof which are encapsulated by the annular housing.

3. A package structure, comprising:
   a base unit having a carrier member, wherein the carrier member has a plurality of union support structures extended outwards from the carrier member and a plurality of projection structures corresponding to the union support structures, and each of the projection structures is adjacent to each of the union support structures and is extended outwards from a corner of the carrier member;
   a pin unit having a plurality of conductive pins disposed beside the carrier member; and
   a housing unit having an annular housing encircling the carrier member to envelop one part thereof and connecting to the pin unit, wherein the union support structures and the projection structures are encapsulated by the annular housing, and each of the union support structures has a union cutting plane formed on an end thereof and exposed from housing unit.

4. The package structure according to claim 3, wherein the substrate unit has at least one through hole penetrating through the carrier member, at least one annular structure is formed in the at least one through hole, and the annular housing is partially filled into the at least one through hole to cover the at least one annular structure.

5. The package structure according to claim 3, wherein the carrier member has four sides, two pairs of union support structures and two pairs of projection structures, the two pairs of union support structures are respectively disposed on two opposite sides of the carrier member, each of the projection structures is connected to each of the union support structures, and the two pairs of projection structures are respectively projected from another two opposite sides of the carrier member.

6. The package structure according to claim 3, wherein the carrier member has two union support structures and four projection structures, the two union support structures are respectively disposed on the two opposite sides of the carrier member, every two projection structures are respectively disposed beside two opposite sides of each of the union support structures and respectively projected from two corresponding corners of the carrier member.

7. An LED package structure, comprising:
   a base unit having a carrier member and at least one through hole penetrating through the carrier member, wherein at least one annular structure is formed in the at least one through hole;
   a pin unit having a plurality of conductive pins disposed beside the carrier member;
   a housing unit having an annular housing encircling the carrier member to envelop one part thereof and connecting to the pin unit, wherein the annular housing is partially filled into the at least one through hole to cover the at least one annular structure;
   a light-emitting unit having a plurality of LED chips disposed on the carrier member and being surrounded by the annular housing, wherein each of the LED chips is electrically connected between any two of the conductive pins; and
   a package unit having a light-transmitting package body covering the LED chips and being surrounded by the annular housing;
   wherein the carrier member has a plurality of union support structures encapsulated by the annular housing and extended outwards from the carrier member and a plurality of projection structures corresponding to the union support structures, the union support structures and the projection structures are encapsulated by the annular housing, each of the union support structures has a union cutting plane formed on an end thereof and exposed from the housing unit, and each of the projection structures is adjacent to each of the union support structures and is extended outwards from a corner of the carrier member.

8. The LED package structure according to claim 7, wherein each of the LED chips is electrically connected between any two of the conductive pins by at least two conductive wires, and the LED chips are selectively electrically connected between any two of the conductive pins in parallel or in series.

9. The package structure according to claim 7, wherein the carrier member has at least one annular lateral trench or annular lateral projection encapsulated by the annular housing and a plurality of lateral trenches or lateral projections encapsulated by the annular housing.

10. The package structure according to claim 7, wherein the at least one annular structure is an inner trench or inner projection, and the conductive pins are disposed beside both opposite sides of the carrier member.

11. The package structure according to claim 7, wherein the annular housing surrounds a peripheral portion of the carrier member and envelops one part of the carrier member to expose partially a top surface and a bottom surface of the carrier member, each of the conductive pins has a first end portion and a second end portion, and each of the conductive pins is partially encapsulated by the annular housing to expose the first end portion and a top surface of the second end portion.

12. The package structure according to claim 7, wherein the annular housing has an encircling housing surrounding the carrier member and at least two extending housings extended from an inner surface of the encircling housing to the carrier member to envelop a top surface of the carrier member.

* * * * *